United States Patent [19]

Nakanishi et al.

[11] Patent Number: 5,693,578
[45] Date of Patent: Dec. 2, 1997

[54] METHOD OF FORMING THIN SILICON OXIDE FILM WITH HIGH DIELECTRIC BREAKDOWN AND HOT CARRIER RESISTANCE

[75] Inventors: Toshiro Nakanishi; Yasuhisa Sato; Masaki Okuno, all of Kawasaki, Japan

[73] Assignee: Fujitsu, Ltd., Kawasaki, Japan

[21] Appl. No.: 606,681

[22] Filed: Feb. 26, 1996

Related U.S. Application Data

[63] Continuation of Ser. No. 260,213, Jun. 14, 1994, abandoned.

[30] Foreign Application Priority Data

Sep. 17, 1993 [JP] Japan ................ 5-231944

[51] Int. Cl.$^6$ ................................ H01L 21/02
[52] U.S. Cl. ........................... 437/238; 437/239
[58] Field of Search ..................... 437/238, 239; 148/DIG. 116, DIG. 117, DIG. 118; 118/724

[56] References Cited

U.S. PATENT DOCUMENTS

| | | | |
|---|---|---|---|
| 4,341,592 | 7/1982 | Shortes | 156/646.1 |
| 4,409,260 | 10/1983 | Pastor et al. | 437/239 |
| 4,872,947 | 10/1989 | Weng et al. | 437/238 |
| 4,906,595 | 3/1990 | van der Plas et al. | 437/239 |
| 5,057,463 | 10/1991 | Bryant et al. | 437/239 |
| 5,089,441 | 2/1992 | Moslehi | 437/225 |
| 5,229,334 | 7/1993 | Kato | 437/239 |
| 5,294,571 | 3/1994 | Fujisuiro et al. | 437/239 |
| 5,316,981 | 5/1994 | Gardner et al. | 437/239 |
| 5,330,935 | 7/1994 | Dobuziusky et al. | 437/239 |
| 5,360,769 | 11/1994 | Thokur et al. | 437/239 |

FOREIGN PATENT DOCUMENTS

| | | |
|---|---|---|
| 01290758 | 5/1988 | Japan . |
| 1297827 | 11/1989 | Japan . |
| 01305526 | 12/1989 | Japan . |
| 2189920 | 7/1990 | Japan . |
| 03134153 | 6/1991 | Japan . |
| 04039931 | 2/1992 | Japan . |
| 04306824 | 10/1992 | Japan . |
| 06132279 | 5/1994 | Japan . |

*Primary Examiner*—John Niebling
*Assistant Examiner*—Thomas G. Bilodeau
*Attorney, Agent, or Firm*—Staas & Halsey

[57] ABSTRACT

A method of forming a silicon oxide film by setting a silicon wafer in a chamber capable of introducing oxidizing gas and being evacuated and by heating the silicon wafer in an oxidizing atmosphere. The method includes the steps of: transporting the silicon wafer into the chamber without contacting the silicon wafer with air; introducing an ozone containing gas into the chamber and setting the interior of the chamber to a predetermined pressure; and heating the silicon wafer to a predetermined temperature and oxidizing the surface of the silicon wafer. The predetermined pressure is preferably between 200 Torr and 0.1 Torr. Ozone may be generated from oxygen by applying ultraviolet rays to the upper space of a silicon wafer. The temperature of ozone to be introduced is preferably low. It is preferable to incorporate infrared heating in order not to excessively heat ozone and to heat a silicon wafer to a high temperature.

23 Claims, 15 Drawing Sheets

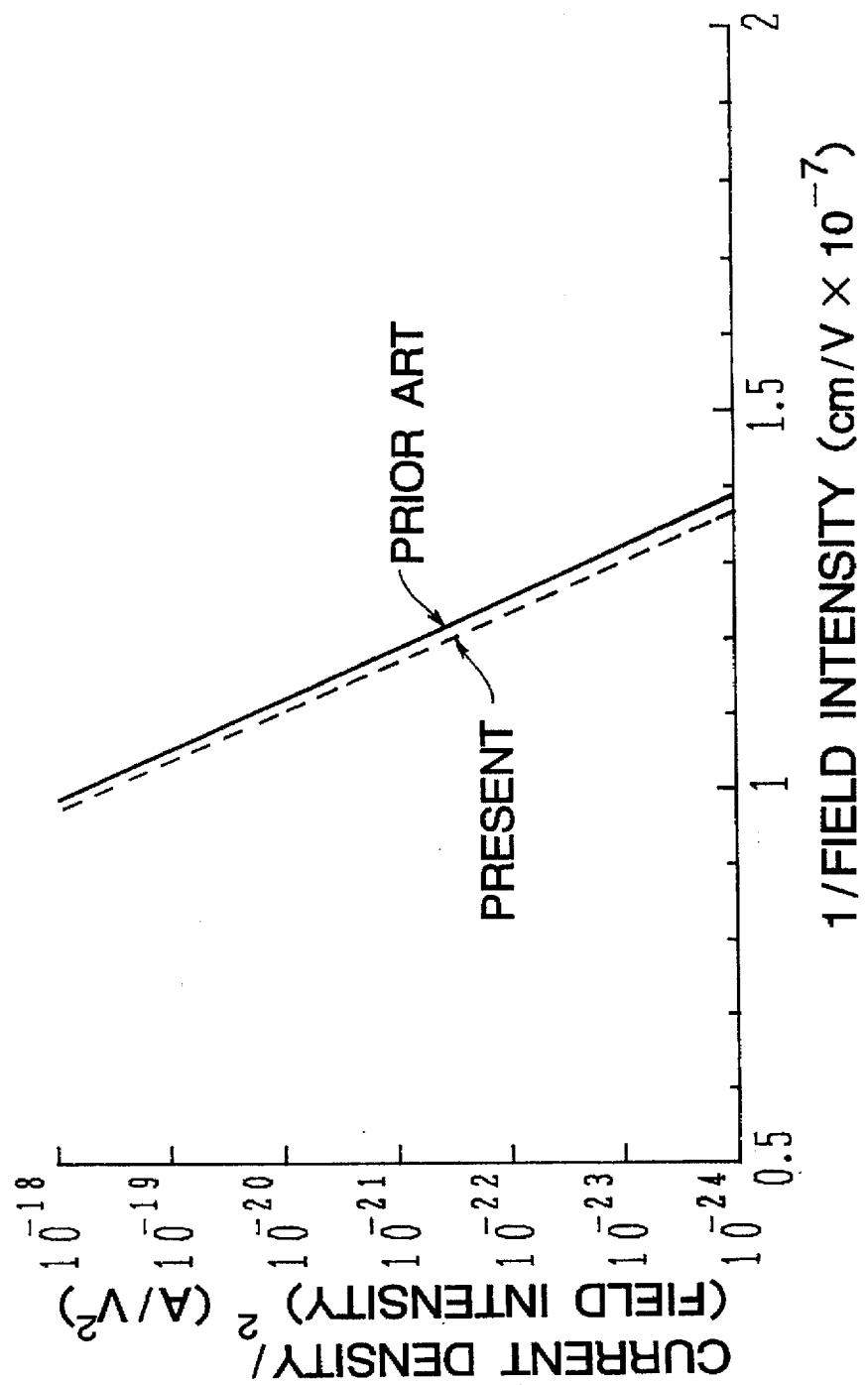

METHOD OF FORMING THIN SILICON OXIDE FILM WITH HIGH DIELECTRIC BREAKDOWN AND HOT CARRIER RESISTANCE

This application is a continuation of U.S. patent application Ser. No. 08/260,213, filed Jun. 14, 1994, now abandoned.

BACKGROUND OF THE INVENTION a) Field of the Invention

The present invention relates to a method of forming a silicon oxide film, and more particularly to a method of forming a thin silicon oxide film to be used as a gate insulating film of a MOS transistor, a tunnel oxide film of a non-volatile memory, a capacitor insulating film of a DRAM, or the like.

b) Description of the Related Art

In the following description, gate oxide film of a MOS-FET is used as a typical example of thin silicon oxide films. The advent of highly integrated LSIs has made a silicon oxide film to be used as a gate insulating film thinner as ever. A method has been desired therefore which can form a thin silicon oxide film having an improved dielectric breakdown voltage and a fair resistance against hot carriers, while maintaining high productivity. Conventionally, a thin oxide film has been formed on the surface of a silicon substrate by partial pressure thermal oxidation under a mixed gas atmosphere containing dry oxygen (pure oxygen) or wet oxygen (oxygen with water vapor) diluted with inert gas.

A thin oxide film having a thickness of about 100 angstroms or less is susceptible to surface contamination and likely to lower a breakdown voltage. Dry oxidation forms oxygen vacancies in a resultant oxide film which has a low time dependent dielectric breakdown (TDDB). Wet oxidation forms hydrogen bonds in a resultant oxide film which has a considerably low resistance against hot carriers. The reason for this is that the bonding energy between a silicon atom and a hydrogen atom is 318 kJ/mol which is lower than 622 kJ/mol of the bonding energy between a silicon atom and an oxygen atom so that hydrogen bonds are likely to broken by hot carriers.

In a known method of preventing generation of oxygen vacancies, silicon is oxidized in an ozone containing oxygen atmosphere under an atmospheric pressure (Japanese Patent Laid-open Publication No. 2-146201). With this method, the concentrations of ozone vary with positions and the film thicknesses in one batch process are various.

Rapid thermal oxidation (RTO) under an ozone atmosphere is also known (Japanese Patent Laid-open Publication No. 1-134153). With this method, the uniformity of in-plane film thickness is poor.

SUMMARY OF THE INVENTION

It is an object of the present invention to provide a technique of forming an oxide film having less oxygen vacancy and hydrogen bond.

According to one aspect of the present invention, there is provided a method of forming a silicon oxide film having the steps of transporting a silicon wafer without contacting the silicon wafer with air into a chamber capable of introducing oxidizing gas and being evacuated, introducing gas containing ozone into the chamber and setting the pressure in the chamber to a predetermined value, and heating the silicon wafer to a predetermined temperature in an atmosphere of the gas containing ozone to oxidize the surface of the silicon wafer.

According to another aspect of the present invention, there is provided a method of forming a silicon oxide film having the steps of transporting a silicon wafer without contacting the silicon wafer with air into a chamber capable of introducing oxidizing gas and being evacuated, introducing oxygen gas into the chamber and setting the pressure in the chamber to a predetermined value, and heating the silicon wafer to a predetermined temperature while generating ozone by applying ultraviolet rays to the oxygen gas introduced into the chamber to oxidize the surface of the silicon wafer.

Since a silicon wafer is transported into a chamber without contacting it with air, contamination by foreign substances in air and formation of a natural oxide film can be avoided. Since ozone is used as oxidizing gas, it is possible to prevent oxygen vacancies from being formed in a silicon oxide film.

Ozone can be efficiently exposed to a wafer surface by generating ozone by applying ultraviolet rays to oxygen gas.

The predetermined pressure is preferably an atmospheric pressure or lower, or more preferably 200 Torr or lower. At the oxidizing step, water vapor may be introduced into the chamber. One of hydrogen chloride gas and chlorine gas may be introduced into the chamber.

If ozone is supplied in a reduced pressure atmosphere, it becomes possible to lower a collision probability of ozone molecules and suppress decomposition of ozone molecules. Ozone can therefore be efficiently exposed to a wafer surface. In a reduced pressure atmosphere, the mean free path of gas molecules is elongated so that the gas concentration in the chamber becomes uniform, forming a silicon oxide film with a uniform quality.

If water contents are added to ozone gas or oxygen gas in the chamber, a resistance against current stress of a silicon oxide film can be improved. If hydrogen chloride gas or chlorine gas is mixed with ozone gas or oxygen gas in the chamber, the amount of metallic impurities to be mixed in a silicon oxide film can be reduced.

In order to ensure the effects of ozone, gas containing ozone is preferably cooled prior to introducing the gas into the chamber at the oxidizing step. For example, it is cooled down to a temperature range From a liquid nitrogen temperature to the room temperature. In order to reduce decomposition of the introduced ozone, a silicon wafer is preferably heated rapidly by an infrared lamp, and gas containing ozone is supplied to the wafer surface with less heating to oxidize the wafer surface. In place of lamp heating, an internal heater may be mounted in the chamber or an induction heater may be used to heat a silicon wafer.

By cooling ozone to be introduced into the, decomposition of ozone can be suppressed and the amount of ozone supplied to a wafer surface can be increased. If a silicon wafer is heated by an infrared lamp, the silicon surface can be heated to a high temperature while suppressing decomposition of ozone. An internal heater or an induction heater may be used while also ensuring the same effects.

In the above manners, a silicon oxide film having a long life time relative to time dependent dielectric breakdown and a high resistance against hot carriers can be obtained. A silicon oxide film with a high uniformity of quality and a high dielectric breakdown voltage can be obtained.

Other objects, features, and advantages of the invention will become apparent from the following description made in conjunction with the accompanying drawings.

BRIEF DESCRIPTION OF THE DRAWINGS

FIG. 4 is a Fowler-Nordheim plot showing the properties of silicon oxide films formed by the first embodiment of the invention and by the conventional method.

DETAILED DESCRIPTION OF THE PREFERRED EMBODIMENTS

Figure 1A:
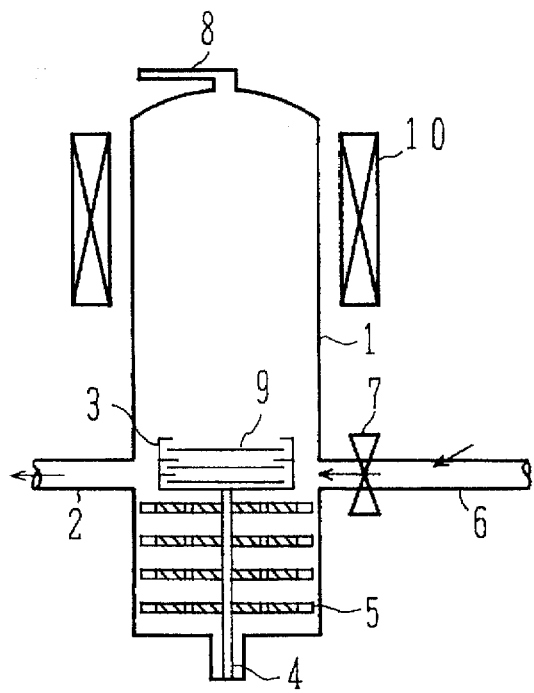
FIGS. 1A to 1E are schematic cross sectional views of system for forming a silicon oxide film, illustrating steps of a method of forming a silicon oxide film according to a first embodiment of the invention.

Referring to FIG. 1A, the structure of an oxidation system used for the embodiment of the invention will be described.

A chamber 1 is of a vertical cylinder type, the upper section thereof for heating a substrate being made of quartz and the lower section for transporting a substrate being made of stainless steel.

The interior of the chamber 1 communicates with an exhaust pipe 2 to which a turbo-molecular pump (not shown) is connected so as to evacuate the interior of the chamber 1. A dry pump (not shown) is also adapted to be connected to the exhaust pipe 2 so as to drain gas In the chamber 1. A quartz carrier 3 is disposed in the chamber 1 to horizontally hold a plurality of wafers spaced apart by a predetermined distance. The carrier 3, although briefly illustrated in FIG. 1A, can hold, for example, ten wafers at a time and has a height of about 7 cm.

The carrier 3 is supported by a carrier supporting shaft 4, and can move up and down in the chamber 1. A plurality of buffer plates 5 each having a number of holes through which gas is drained are disposed under the carrier 3. The buffer plates 5 operate as a thermal shield and form a uniform gas flow. The buffer plates 5 move up and down in the chamber 1 as the carrier 3 moves up and down.

A wafer transport path 6 is connected to the side wall of the chamber 1 so that a wafer can be transported and placed on the carrier when the carrier 3 is positioned at the lower section of the chamber 1, i.e., at the lower temperature area. The wafer transport path 6 is provided with a gate valve 7 which shields the interior of the chamber 1 from the exterior. A wafer is transported and placed on the carrier 3 under the condition that the interior of the chamber 1 and wafer transport path 6 has been evacuated, so that the wafer is prevented from being contaminated by foreign substances of air during the transportation.

A gas supply tube 8 is connected to the top wall of the chamber 1 so as to supply oxygen gas, ozone, or the like to the chamber 1. A resistor heater 10 is disposed to surround the upper quartz section of the chamber 1 so that the interior of the chamber 1 can be heated uniformly.

Next, a method of forming a silicon oxide film according to the first embodiment will be described with reference to FIGS. 1A to 1E.

Silicon wafers to be oxidized are first prepared. As preparatory processes, the wafers are dipped in a mixed solution of $H_2SO_4+H_2O_2$ to remove grease and the like, and then an oxide film is removed by using dilute HF aqueous solution. If the wafers have already thick field oxide films, the field oxide films are not totally removed and only the thin oxide films at active regions are removed. Thereafter, the wafers are boiled in $HNO_3$ aqueous solution to remove metallic impurities on the surfaces of the wafers, and are rinsed by pure water. Next, the wafers are dried in a dry nitrogen flow by using a quartz lamp. These preparatory processes are not limitative, but other processes may also be used. $HNO_3$ boiling may be omitted if unnecessary because this forms a natural oxide film. Instead of removing an oxide film by dilute HF aqueous solution, HF vapor diluted by nitrogen may be used. Oxide removal step may be followed by a process of washing wafers by isopropyl alcohol.

It is preferable that the wafers subjected to the preparatory processes are not exposed to air as much as they can. For example, the silicon wafers subjected to the preparatory processes are placed in an inert gas atmosphere such as nitrogen and transported into a chamber.

FIG. 1A illustrates a process of transporting silicon wafers 9 into the chamber 1. The interior of the chamber 1 is evacuated to $1 \times 10^{-6}$ Torr, and the gate valve 7 is opened. At this moment, the interior of the wafer transport path 6 having prepared wafers has been also evacuated. Since wafers are transported in vacuum, it is possible to prevent a natural oxide film from being formed on the wafer surface. Wafers 9 are transported into the chamber 1 and held by the carrier 3.

Figure 1B:
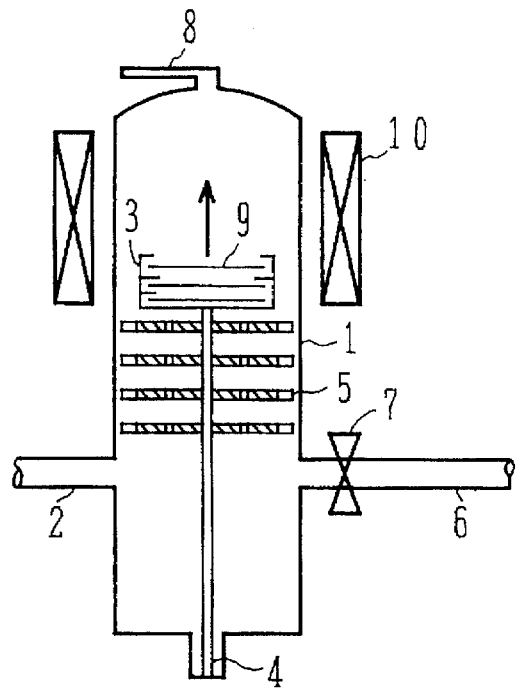

FIG. 1B illustrates a process of moving wafers to the high temperature section of the chamber 1.

The gate valve 7 is closed, and a mixed gas of oxygen and ozone of 9 volume % is supplied to the chamber 1 to thereafter set the inner pressure to 63 Torr. In this case, the upper high temperature section is being set to 900° C.

The carrier 3 is moved up in the arrow direction to move wafers to the high temperature section. If wafers are heated in vacuum, the wafer surfaces are etched to have irregular surfaces. In this embodiment, prior to moving wafers to the high temperature section, ozone and oxygen are introduced into the chamber 1 so that a good thin oxide film is formed on the wafer surface, preventing an irregular surface of the wafer.

Figure 1C:
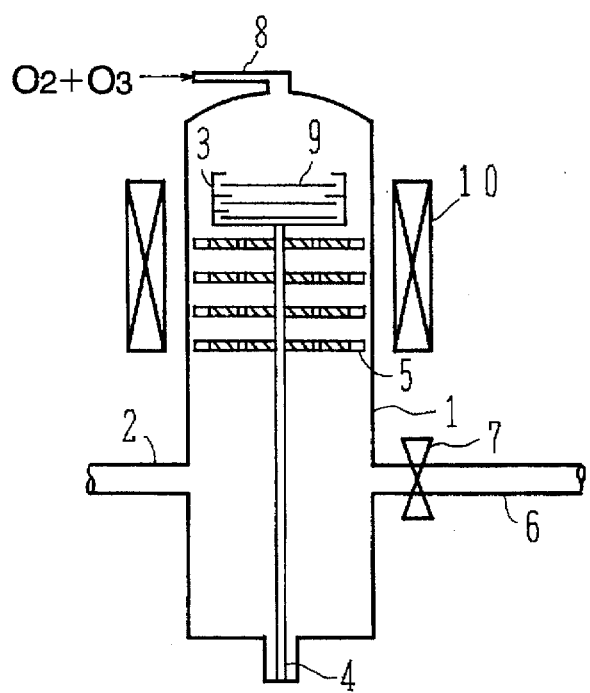

FIG. 1C illustrates a process of oxidizing wafers. Wafers are positioned at a uniformly heated region of the chamber 1 to oxidize them in a flow of oxygen gas containing ozone. At this time, the inner pressure of the chamber is 63 Torr, and the temperature of wafers is 900° C.

An activation energy for decomposing an ozone molecule into an oxygen molecule and an oxygen radical is 0.6 kJ/mol, and an activation energy for composing an oxygen molecule from an oxygen radical and an ozone molecule is as small as 1 kJ/mol. Therefore, an ozone molecule meeting an oxygen radical before it reaches the wafer surface easily composes oxygen molecules. If all ozone molecules are transformed into oxygen molecules, the process is the same as a normal oxidation process. It is preferred that as much ozone molecules as possible can reach wafer surfaces and decompose thereat.

Under a reduced pressure of the chamber 1, the collision probability of ozone molecules is reduced and the decomposition of an ozone molecule into an oxygen molecule can be suppressed. Also under the reduced pressure, the mean free path of gas molecules becomes short and the time required for making the gas concentration in the chamber 1 uniform can be shortened, thereby allowing a uniform film to be formed with good controllability. Under the reduced pressure of 200 Torr or lower in the chamber 1, a resistance against current stress of a silicon oxide film can be improved.

When the pressure is below 0.1 Torr, however, there occurs oxidized surface roughness or chapping. If the pressure is further reduced, no oxidation occurs, probably due to the shortage of oxygen in the atmosphere.

Therefore, a pressure range between 200 Torr and 0.1 Torr is preferable.

Figure 1D:
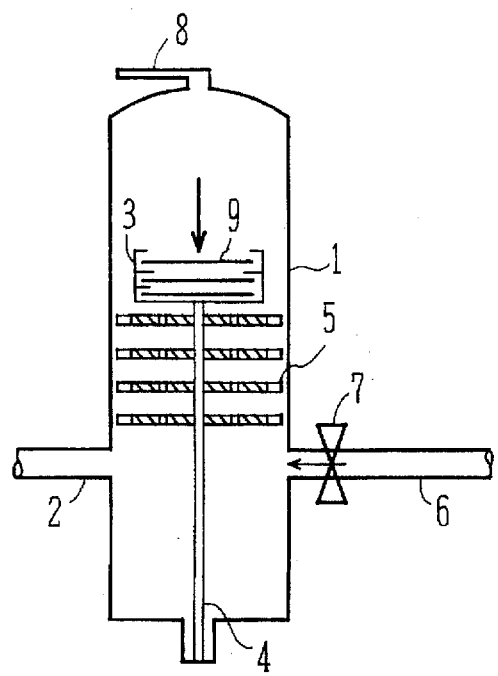

FIG. 1D illustrates a process of moving wafers having Formed with oxide films to the lower temperature section. After oxide films having a desired thickness are formed, the carrier 3 is moved down in the arrow direction to move wafers to the lower temperature section. The temperatures of wafers are lowered automatically as they are moved to the lower temperature section. A supply of ozone and oxygen gasses is stopped, and the interior of the chamber 1 is again evacuated to $1 \times 10^{-6}$ Torr.

Figure 1E:
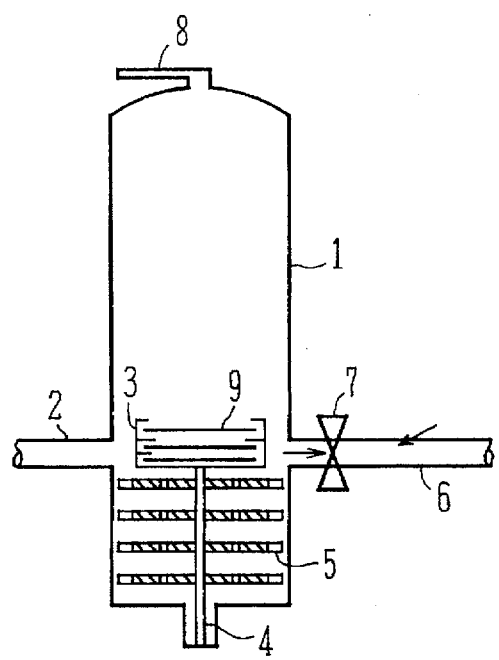

FIG. 1E illustrates a process of transporting wafers to the outside of the chamber. The gate valve 7 is opened, and the wafers held by the carrier 3 are transported into the wafer transport path 6 and picked up therefrom.

In the above embodiment, oxidation is performed at a pressure of 63 Torr and at a temperature of 900° C. The pressure and temperature have a specific correlation. Under a reduced pressure atmosphere, other combinations of the pressure and temperature may be used. As the pressure or temperature rises, an oxidation rate rises. Therefore, for example, if the pressure is raised to 200 Torr, the temperature can be lowered to 850° C. to obtain substantially the same oxidation rate. Preferably, the oxidation temperature is set in the range from 700° C. to 1100° C.

With the above processes, a silicon oxide film of a good quality can be formed on the silicon surface. It is possible to form a silicon oxide film required to be thin as well as to have a high insulating property, such as a gate oxide film of a MOSFET and dielectric film of a DRAM capacitor.

Reliability of various types of MOSFETs can be improved by employing the above-described oxide film as the gate oxide film. For example, the gate oxide film of MOSFETs in logic ICs can be formed of these silicon oxide film. In particular, good tunneling gate oxide films can be formed in non-volatile memory device, such as flash memory device. Oxide films having a thin thickness capable of being tunneled by electrons and a good and uniform quality capable of blocking electrons in stable state will raise the data retention characteristics.

FIGS. 2A to 3B are breakdown histograms of oxide films formed by the first embodiment method and comparative breakdown histograms of oxide films formed by a conventional method of oxidation in an oxygen gas atmosphere without supplying ozone. Sample wafers had the (100) plane grown by Czochralski method. The preparatory processes include removing grease by $H_2SO_4/H_2O_2$, removing an oxide film by dilute HF aqueous solution, removing metallic impurities by $HNO_3$, and rinsing by pure water. Oxide films having a thickness of 4 nm were formed on the surfaces of the sample wafers.

Figure 2A:
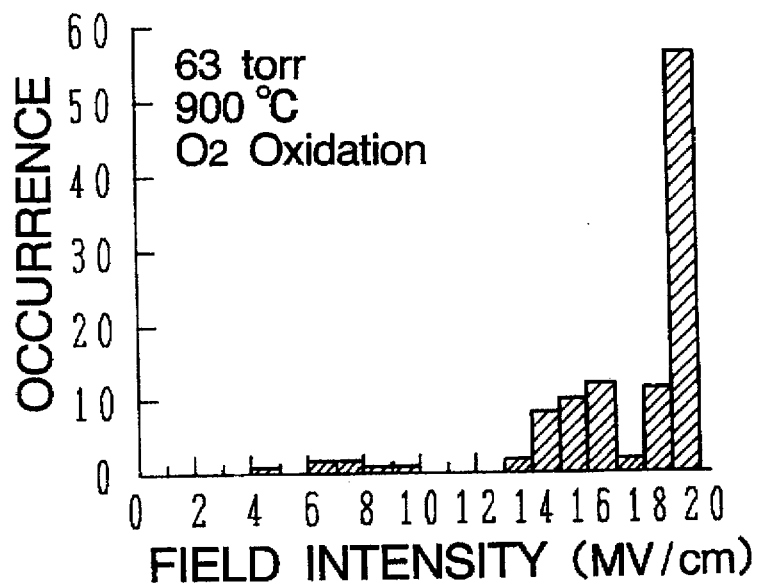
FIGS. 2A, 2B, 3A, and 3B are breakdown voltage histograms of silicon oxide films formed by the first embodiment of the invention and by a conventional method.
Figure 2B:
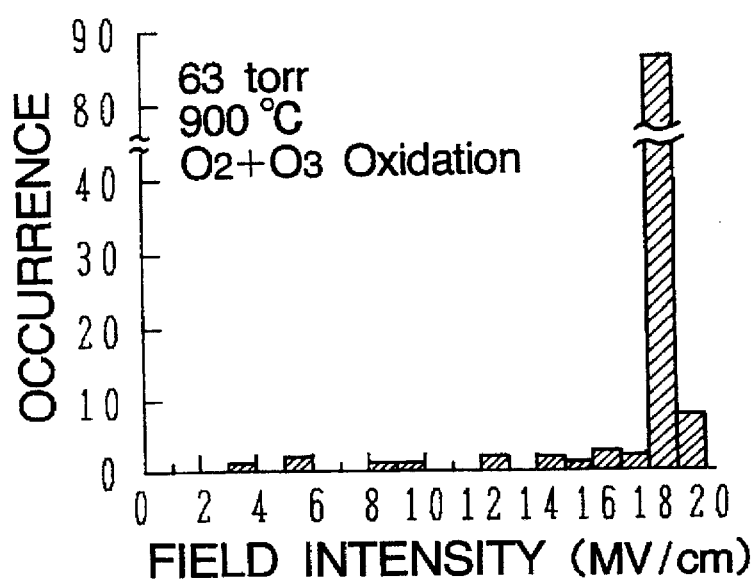
Figure 3A:
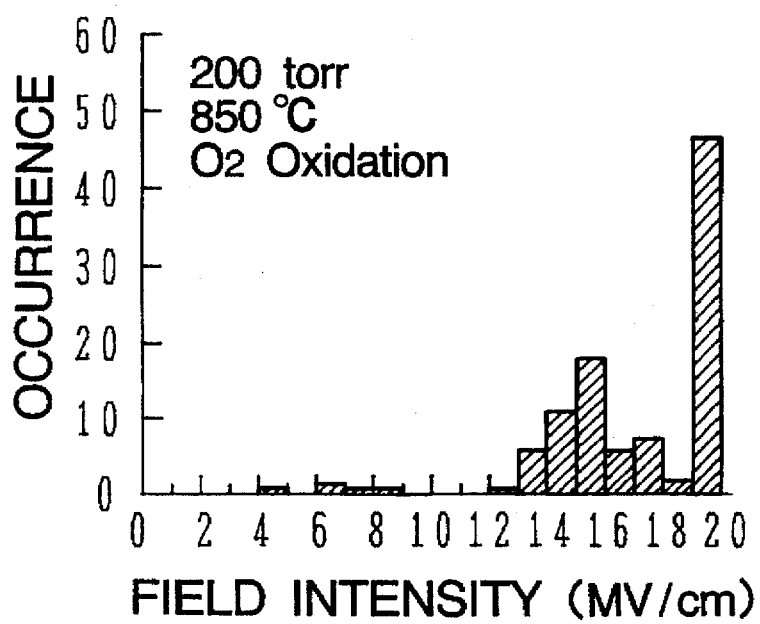
Figure 3B:
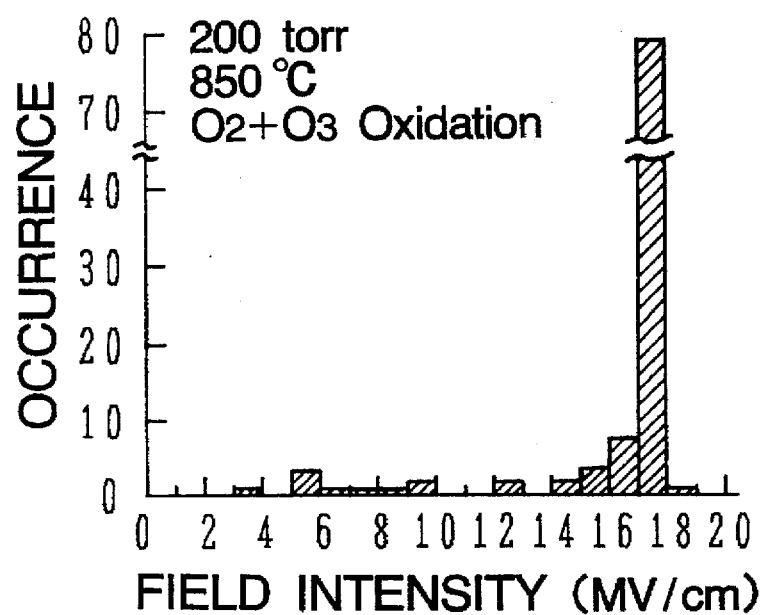

FIGS. 2A and 2B are histograms of oxide films formed at a pressure of 63 Torr and at a temperature of 900° C., and FIGS. 3A and 3B are histograms of oxide films formed at a pressure of 200 Torr and at a temperature of 850° C. Oxide films of FIGS. 2A and 3A were formed by using only oxide gas, and oxide films of FIGS. 2B and 3B were formed by using a mixed gas of oxygen and ozone of 5 volume %.

The abscissa represents a field intensity applied to sample oxide films, and the ordinate represents the number of sample oxide films broken down. A current flow of 500 μA or more in an area of 0.105 cm$^2$ was assumed to be a dielectric breakdown.

In both the embodiment method and conventional method, the number of samples broken down increases abruptly above a field intensity of about 17 MV/cm. This is considered to be due to a tunnel current.

In the case of oxidation using only oxygen gas, the number of samples broken down becomes large at a field intensity of 13 to 17 MV/cm both at the oxidation temperatures of 900° C. and 850° C. The reason is presumably a partial breakdown at weak spots in the oxide film.

In the case of oxidation using a mixed gas of oxygen and ozone, the number of samples broken down before a tunnel current flows, is small. By using oxidizing atmosphere containing ozone, B-mode defects generating dielectric breakdown at weak spots were reduced. It is conceivable that in the oxidation using a mixed gas of oxygen and ozone, generated oxygen radicals efficiently bond to oxygen vacancies and prevent oxygen vacancies from being generated.

FIG. 4 is a Fowler-Nordheim plot showing the properties of silicon oxide films formed by the first embodiment and by a conventional method. The abscissa represents an inverse of a field intensity, and the ordinate represents a current density divided by a square of the field intensity. A solid line stands for an oxide film formed by the conventional method, and a broken line stands for an oxide film formed by the first embodiment. The properties of the oxide films of both the embodiment and conventional methods are represented by straight lines, proving that a tunnel current is flowing.

A current value of the first embodiment is a half of that of the conventional method. This is conceivable from that the number of traps in an oxide film was reduced.

Figure 5:
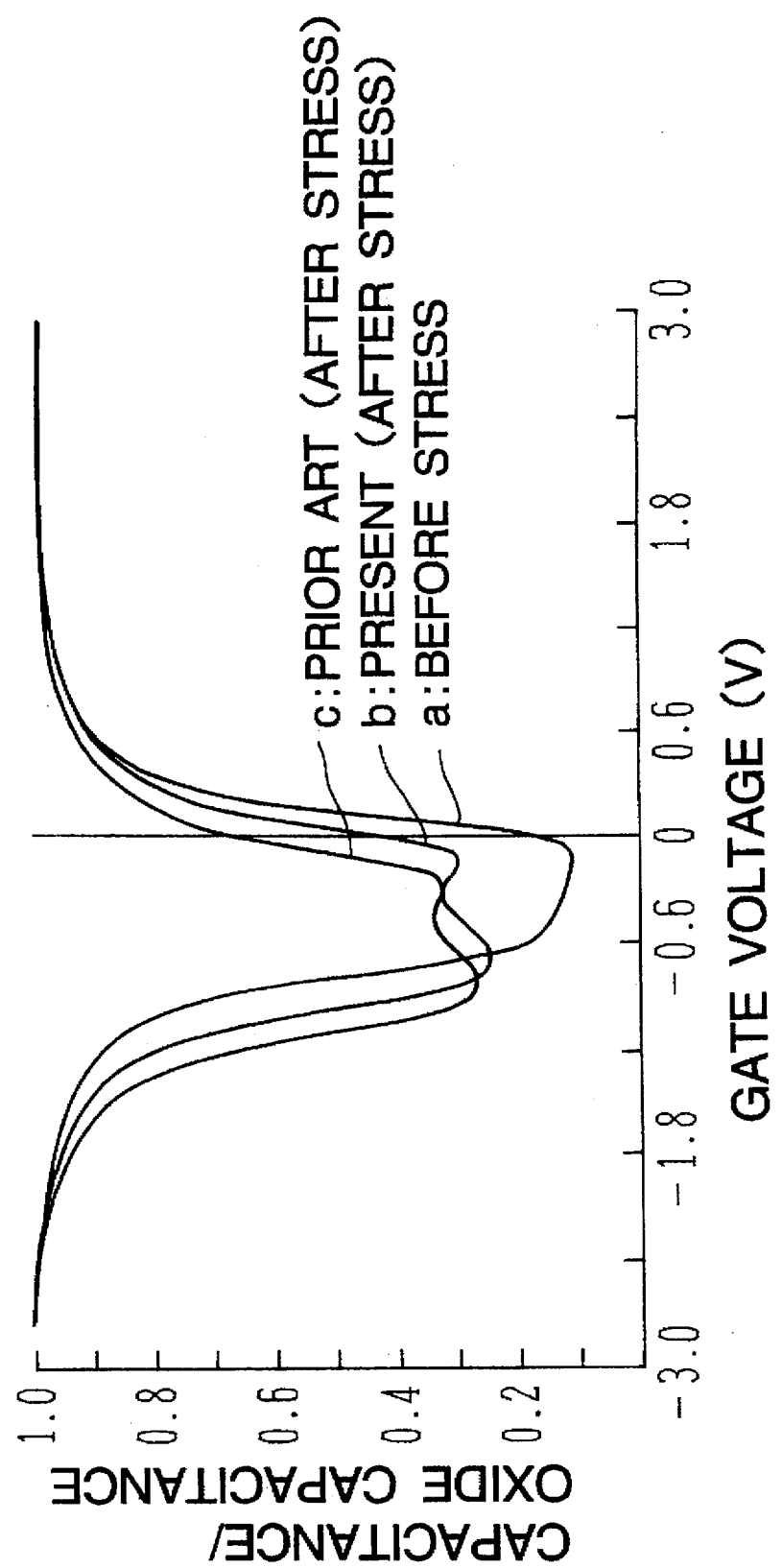
FIG. 5 is a graph showing C-V characteristics of MOS capacitors with silicon oxide films formed by the first embodiment of the invention and by the conventional method.

FIG. 5 is a graph showing the capacitance-voltage (C-V) characteristics of a MOS capacitor before and after a stress of a tunnel current of 1 C/cm$^2$ is applied. The abscissa represents a gate voltage, and the ordinate represents a capacitance. A curve a indicates the C-V characteristics before a stress is applied, a curve b indicates the C-V characteristics of a MOS capacitor having silicon oxide films of the first embodiment after a stress was applied, and a curve c indicates the C-V characteristics of a MOS capacitor formed by a conventional method after a stress was applied.

Although the minimum capacitance value rises as a stress is applied, the degree of this rise of the embodiment is smaller than that of the conventional method. This implies that the silicon oxide film of this embodiment has a less number of interface energy levels.

Figure 6:
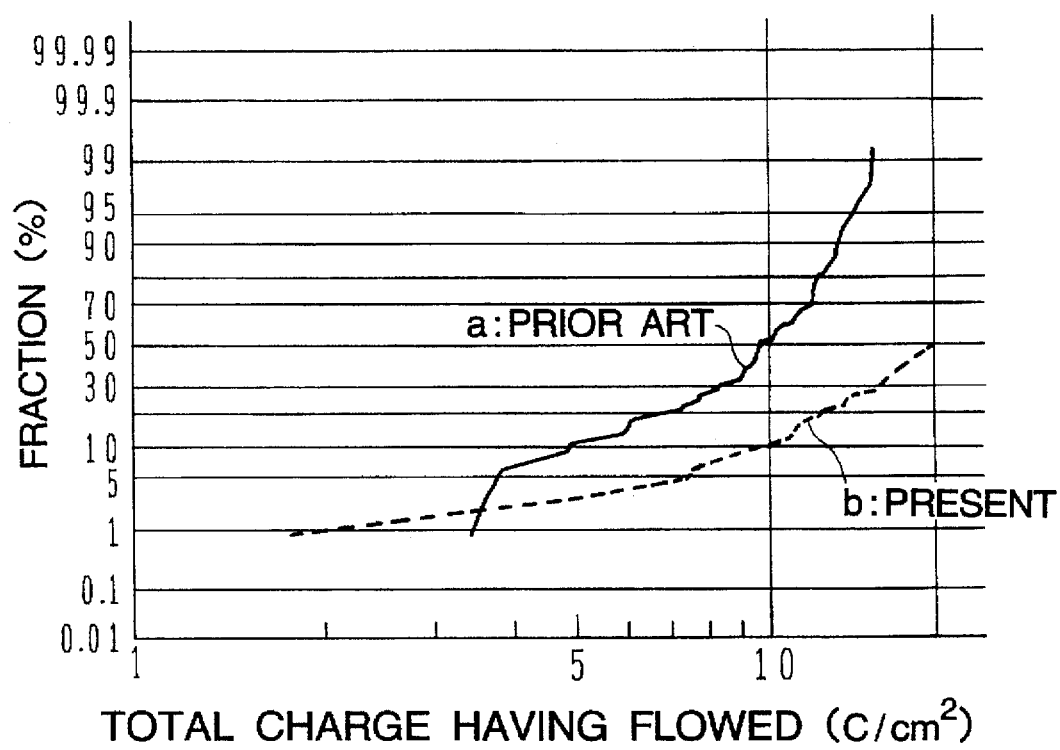
FIG. 6 is a graph showing the time dependent dielectric breakdown characteristics of silicon oxide films formed by the first embodiment of the invention and by the conventional method.

FIG. 6 is a graph showing the time dependent dielectric breakdown (TDDB) characteristics of a MOS capacitor when a constant current of 100 mA/cm$^2$ has been flowed therethrough. The abscissa represents a Total charge C/cm$^2$ having flowed until a breakdown occurs, and the ordinate represents a fraction % of samples broken down.

A curve a stands for MOS capacitors formed by a conventional method, and a curve b stands for MOS capacitors formed by the embodiment method. The total charge required for the dielectric breakdown of, for example, 50% samples, is about 10 C/cm$^2$ in the case of the conventional method, and about 20 C/cm$^2$ in the case of the embodiment method which is twice as large as the conventional method. It can be understood from this that the embodiment method improves the time dependent dielectric breakdown characteristics as compared to the conventional method.

Figure 7:
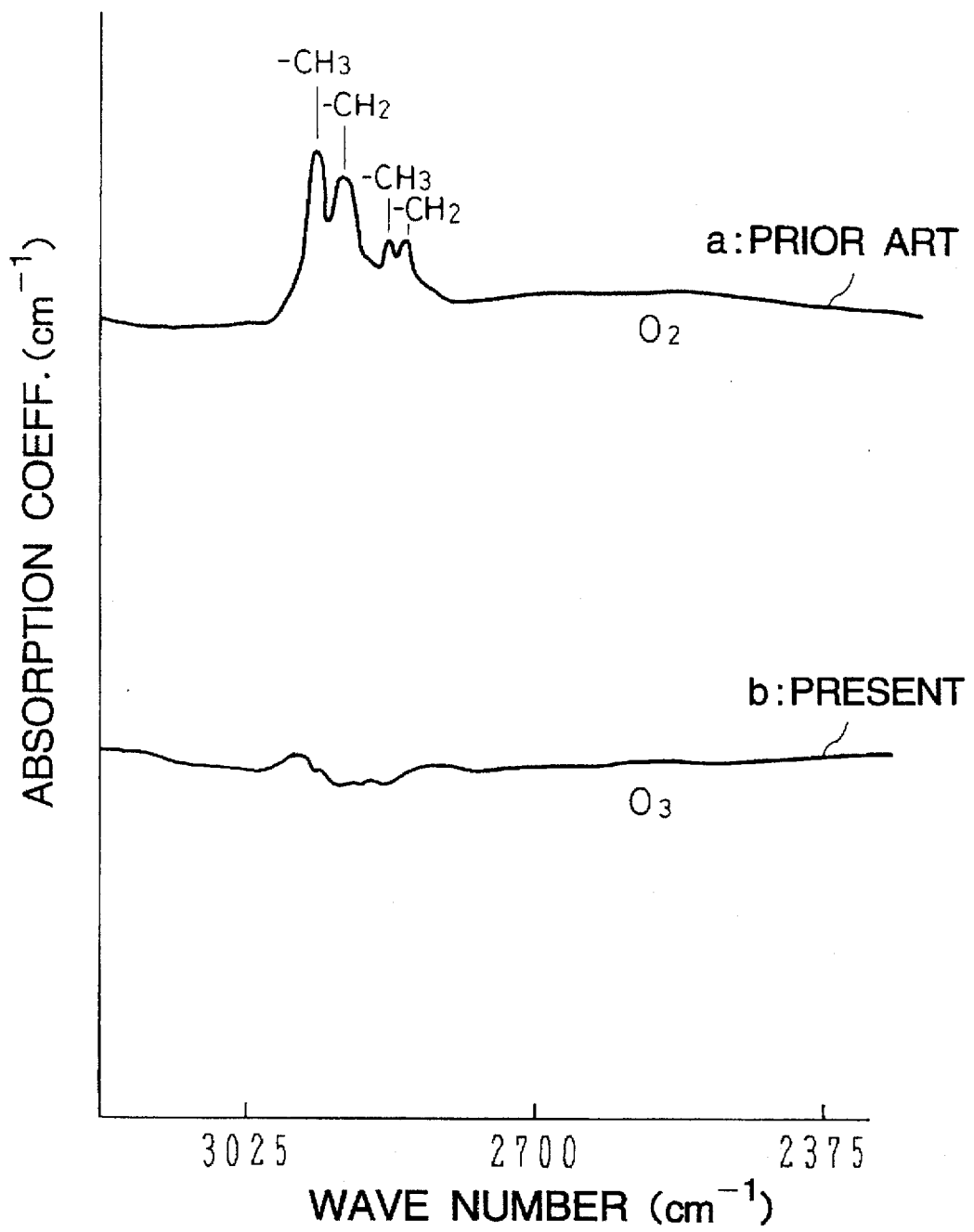
FIG. 7 is a graph showing the organic substance content characteristics of silicon oxide films formed by the first embodiment of the invention and by the conventional method.

FIG. 7 is a graph showing the contents of organic material in silicon oxide films observed by Fourier Transform Infra-Red Attenuated Total Reflection (FTIR-ATR). The abscissa represents a wave number, and the ordinate represents an absorption coefficient. A curve a stands for an oxide film formed by a conventional method, and a curve b stands for an oxide film formed by the embodiment method.

The silicon oxide film formed by the conventional method has peaks corresponding to CH$_3$ and CH$_2$ groups, whereas the silicon oxide film formed by the embodiment method has almost no peak. A silicon oxide film having almost no organic material can be formed by the embodiment method. It is supposed that organic material containing CH$_3$ and CH$_2$ is decomposed by ozone.

From the experimental results of oxide films formed by the embodiment method and conventional method, it can be understood that silicon oxide films of a high quality can be formed by the embodiment method. It is conceivable that oxygen radicals decomposed from ozone contribute to forming a good quality silicon oxide film.

Figure 8:
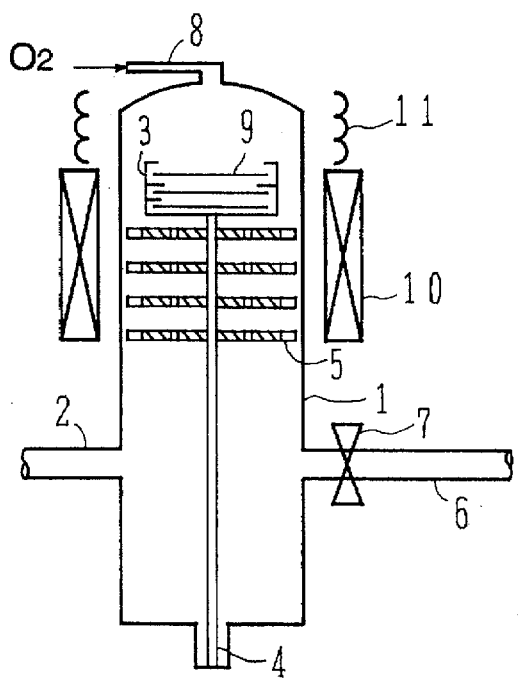
FIGS. 8 to 13 are schematic cross sectional views of systems for forming silicon oxide film, illustrating methods of forming a silicon oxide film according to second to seventh embodiments of the invention.

FIG. 8 is a schematic cross sectional view of a system for forming a silicon oxide film, illustrating a method of forming a silicon oxide film according to a second embodiment of the invention.

A different point of the second embodiment from the first embodiment is that instead of supplying a mixed gas of ozone and oxygen to a chamber 1 during an oxidation process, oxygen gas is supplied and partially changed to ozone by exposing the oxygen gas to ultraviolet rays before it reaches the surface of a wafer 9. An ultraviolet light source 11 is therefore mounted at the peripheral area of the chamber 1 between the opening of a gas supply tube 8 and a heater 10. Ultraviolet rays radiated from the ultraviolet light source 11 transmit through the chamber 1 made of quartz and are applied to the gas in the chamber 1.

It is conceivable that ultraviolet rays having an excitation wavelength of 134 nm or shorter, 147 nm, or 209 nm can be used for generating ozone. It is conceivable that ultraviolet rays having an excitation wavelength of 220 to 310 nm, or 320 to 360 nm can be used for generating oxygen radicals from ozone. As the ultraviolet light source 11, a high pressure mercury lamp or a heavy hydrogen lamp may be used.

Ozone is generated near the wafers by applying ultraviolet rays to oxygen gas in the chamber 1 so that the amount of ozone not decomposed and reaching the wafer surface can be increased. A mixed gas of ozone and oxygen may be supplied from the gas supply tube 8 and exposed to ultraviolet rays. In this case, the amount of ozone reaching the wafer surface is further increased.

Figure 9:
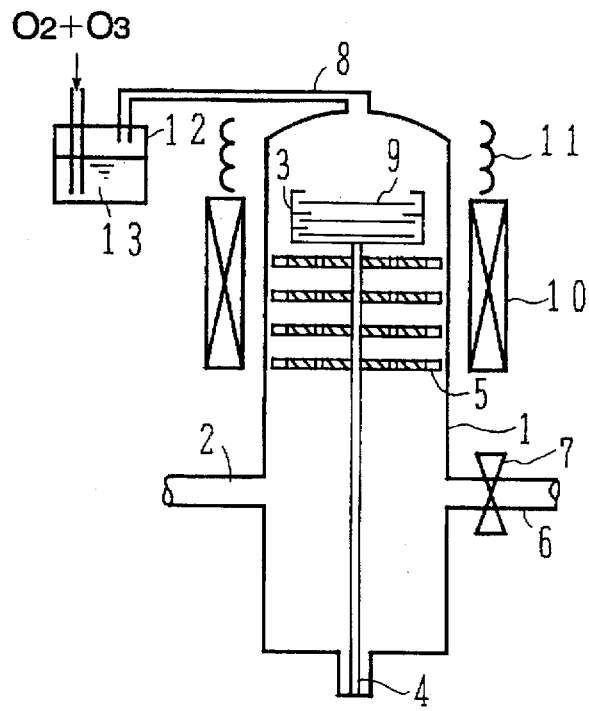

FIG. 9 is a schematic cross sectional view of a system for forming a silicon oxide film, illustrating a method of forming a silicon oxide film according to a third embodiment of the invention.

A different point of the third embodiment from the first embodiment is that instead of supplying dry ozone (O$_2$+O$_3$) to a chamber 1, wet ozone gas bubbled in distilled water is supplied. A gas supply tube 8 is therefore connected to a vessel 12 containing distilled water 13. Wet ozone containing oxygen gas bubbled in the distilled water 13 is supplied to the gas supply tube 8.

In this embodiment, ozone containing oxygen gas contains water contents so that a resistance against current stress of a silicon oxide film can be improved.

Only oxygen gas bubbled in distilled water may be supplied to generate ozone by applying ultraviolet rays from an ultraviolet light source 11 to the oxygen gas. The ozone containing oxygen gas bubbled in distilled water may be exposed to ultraviolet rays from the ultraviolet light source 11 to increase an ozone concentration.

Figure 10:
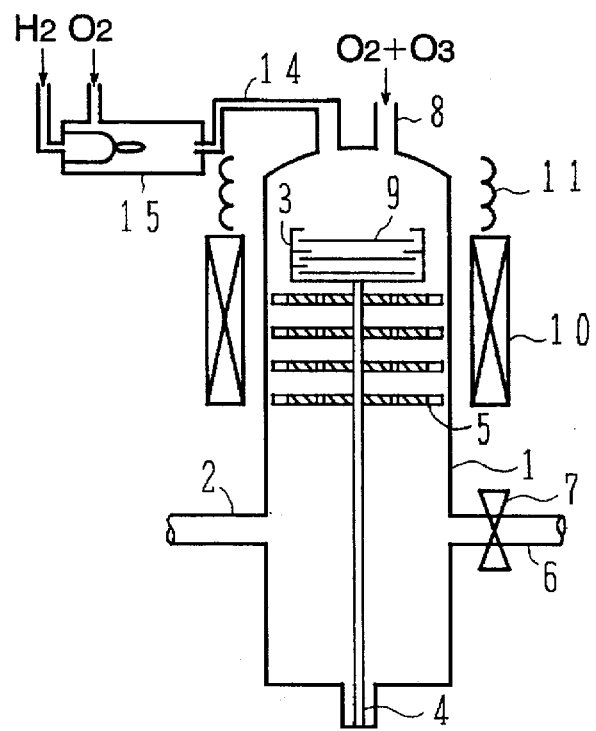

FIG. 10 is a schematic cross sectional view of a system for forming a silicon oxide film, illustrating a method of forming a silicon oxide film according to a fourth embodiment of the invention.

A different point of the fourth embodiment from the third embodiment is that instead of supplying water contents through bubbling in distilled water, vapor gas obtained by burning hydrogen gas with oxygen gas is supplied. In addition to a gas supply tube 8, another gas supply tube 14 is therefore connected to the top wall of a chamber 1. The gas supply tube 14 is connected to a water vapor supply 15. Water vapor obtained by burning hydrogen gas with oxygen gas in the water vapor supply 15 is supplied to the chamber 1. A mixed gas of ozone and oxygen is supplied from the gas supply tube 8.

Also in this embodiment, the same effects as the third embodiment can be obtained. Only oxygen gas may be supplied from the gas supply tube 8 to generate ozone by applying ultraviolet rays from a ultraviolet light source 11 to the oxygen gas. The mixed gas of ozone and oxygen supplied from the gas supply tube 8 may be exposed to ultraviolet rays from the ultraviolet light source 11 to increase an ozone concentration.

Figure 11:
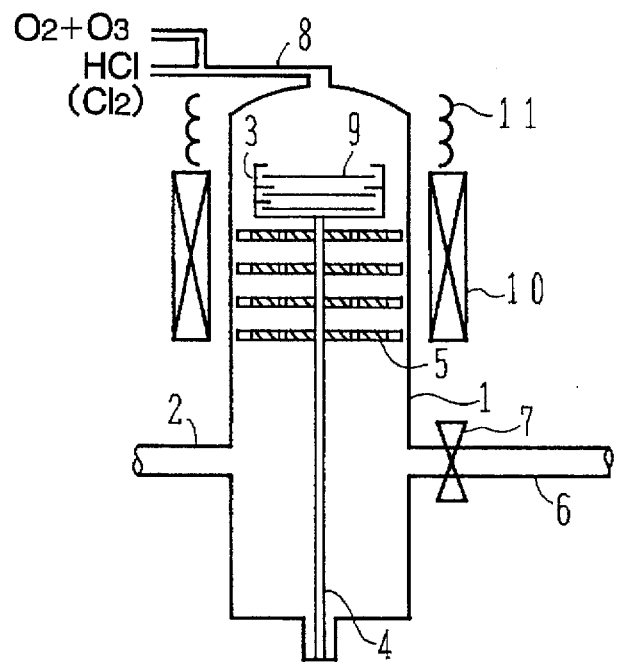

FIG. 11 is a schematic cross sectional view of a system for forming a silicon oxide film illustrating a method of forming a silicon oxide film according to a fifth embodiment of the invention.

A different point of the fifth embodiment from the first embodiment is that hydrogen chloride gas or chlorine gas is added to a mixed gas of ozone and oxygen and supplied to a chamber 1. A gas supply tube 8 is therefore bifurcated on the gas inlet side, one port supplying a mixed gas of ozone and oxygen and the other port supplying hydrogen chloride gas or chlorine gas.

Addition of hydrogen chloride gas or chlorine gas to ozone containing oxygen removes metal in the form of chloride and reduces the amount of metallic impurities mixed to a silicon oxide film. As a result, a breakdown voltage of a silicon oxide film can be raised and a bulk lifetime thereof can be improved.

Hydrogen chloride gas or chlorine gas may be mixed to only oxygen gas and ozone may be generated by applying ultraviolet rays from an ultraviolet light source 11. In this case, the mixed gas of ozone and oxygen mixed with hydrogen chloride gas or chlorine gas may be exposed to ultraviolet rays from the ultraviolet light source 11 to increase an ozone concentration.

Figure 12:
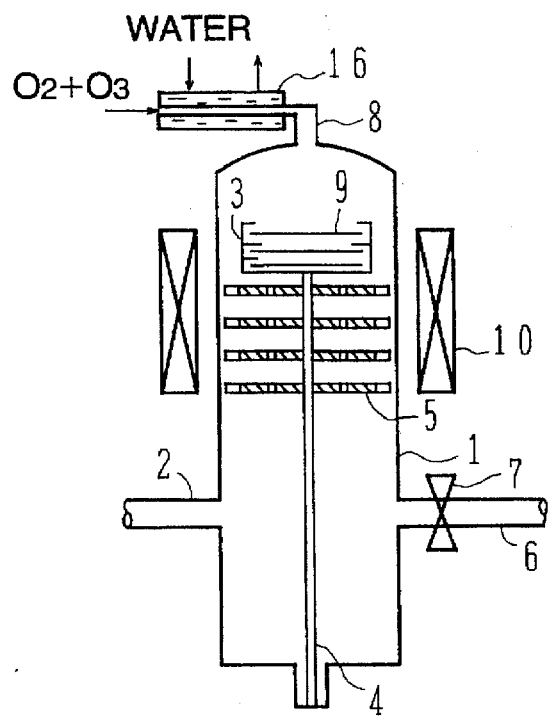

FIG. 12 is a schematic cross sectional view of a system for forming a silicon oxide film illustrating a method of forming a silicon oxide film according to a sixth embodiment of the invention.

A different point of the sixth embodiment from the first embodiment is that a gas supply tube 8 is cooled by water from an ozone supply area downstream to the inlet port of a chamber 1. A water cooler 16 is therefore mounted at the peripheral area of the gas supply tube 8.

The amount of ozone extinguished in the gas supply tube 8 can be reduced by cooling ozone by water. Decomposition of ozone depends upon a temperature. The higher the temperature, the faster the decomposition rate. Therefore, by cooling ozone before supplying to the chamber, the amount of ozone reaching the wafer surface without being decomposed can be increased. The lower the temperature at the gas supply tube 8 at an upstream portion to the chamber 1, an oxide film of a better quality can be formed.

Figure 13:
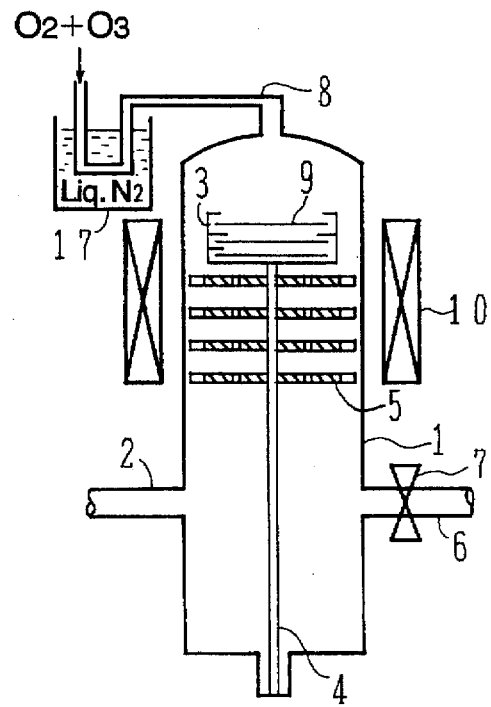

FIG. 13 is a schematic cross sectional view of a system for forming a silicon oxide film illustrating a method of forming a silicon oxide film according to a seventh embodiment of the invention.

A different point of the seventh embodiment from the first embodiment is that a mixed gas of ozone and oxygen is cooled by liquid nitrogen before it is supplied to a chamber 1. A liquid nitrogen cooler 17 is therefore mounted on a gas supply tube 8.

By supplying ozone cooled by liquid nitrogen to the chamber 1, the amount of ozone reaching the wafer surface without being decomposed can be increased. In the seventh embodiment, ozone is cooled by liquid nitrogen. Other coolant may also be used. For example, nitrogen gas, carbon dioxide gas or argon gas may be used. The ozone cooling temperature is preferably between the liquid nitrogen temperature (77K) and the room temperature (about 20°–30° C.) or at a water cooling temperature (about 10° to 30° C.).

In the above embodiments, ozone $O_3$ is additionally generated by applying ultraviolet rays to $O_2$. Other ozone generating mechanism may also be used, for example, generating ozone by electrolysis of water at a high voltage. Prior to forming an oxide film, a wafer may be contacted with hydrogen gas at a high temperature to remove a natural oxide film. This process can be performed by supplying hydrogen gas to silicon wafers in the same chamber at a high temperature. After the natural oxide film is removed, the wafer is moved down to the lower temperature section and the hydrogen gas is replaced by oxidizing gas to perform oxidation.

In the first to seventh embodiments, the quartz chamber 1 is preferably configured into a double-tube quartz structure so that external water contents can be prevented from entering the chamber 1.

Figure 14:
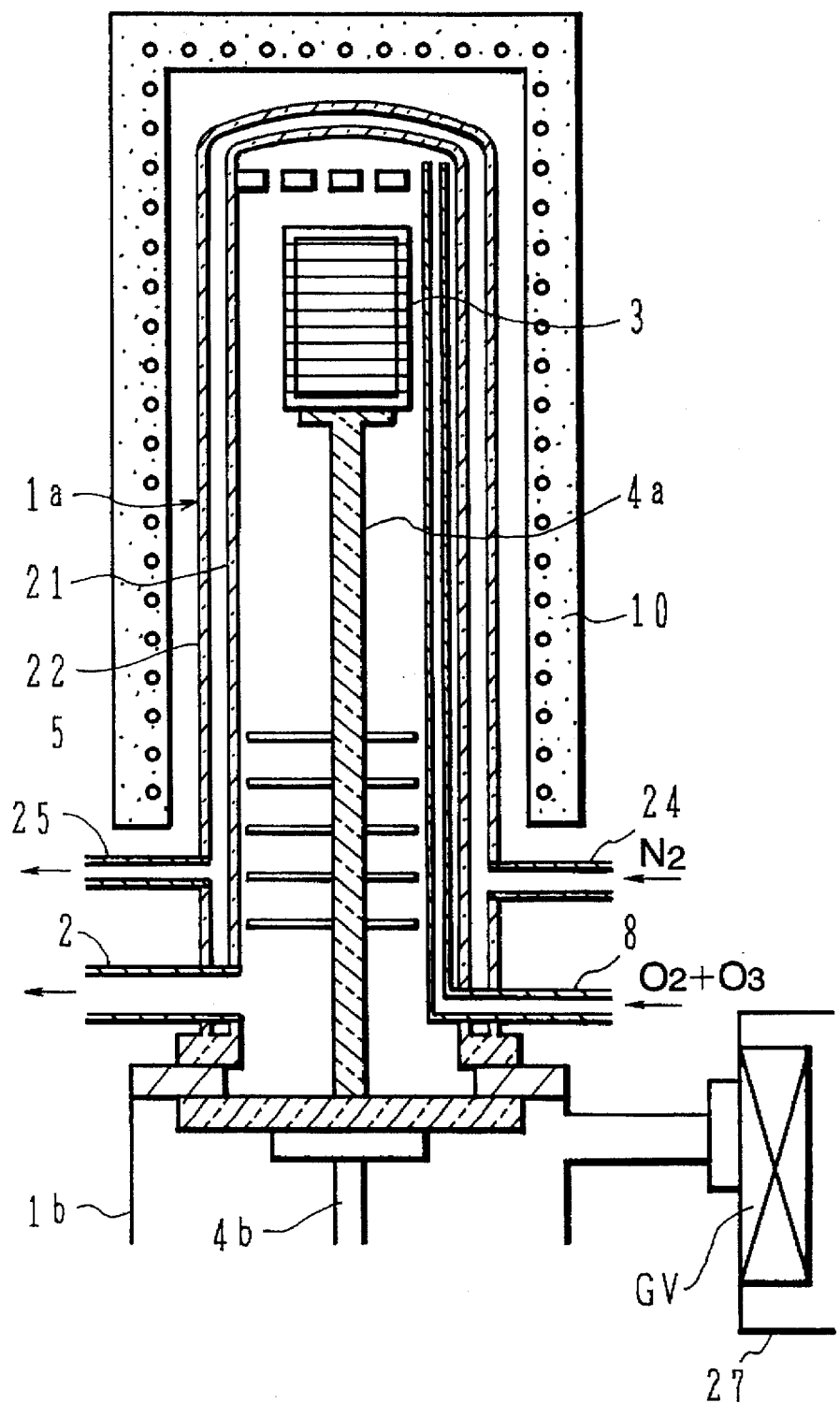
FIGS. 14 and 15 are schematic cross sectional views of systems for forming a silicon oxide film, illustrating methods of forming a silicon oxide film according to further embodiments of the invention.

FIG. 14 is a schematic cross sectional view of an oxidation system according to an eighth embodiment of the invention. In this embodiment, a chamber is constructed of an upper bell jar 1a made of quartz and a lower reservation chamber 1b made of stainless steel. The upper bell jar 1a is of a double-wall structure having an inner wall 21 and an outer wall 22. A space between the inner and outer walls 21 and 22 is filled with gas supplied from a gas inlet port 24 which is exhausted from a gas outlet port 25. For example, $N_2$ gas is introduced from the gas inlet port 24 and drained from the gas outlet port 25. A gas supply tube 8 for supplying oxygen and ozone is routed from the lower portion of the bell jar 1a to the upper portion thereof so as to supply gas downward to wafers held by a carrier 3. The material of the higher temperature section of this oxidation system is made of quartz excepting a resistor heater 10.

A wafer transport path is connected to the side wall of the reservation chamber 1b, the wafer transport path being connected via a gate valve GV to a transport chamber 27 which accommodates a transport robot therein.

With the oxidation system of this embodiment having the chamber of a quartz double-wall structure, it was possible to lower the partial pressure of water vapor in the chamber to several hundreds ppb.

In this embodiment, wafers are heated in a resistor furnace. Resistor heating lets the whole environment as well as wafers to be heated to a high temperature so that the temperature of introduced gas can be easily raised. With heated ozone, the decomposition is speeded up.

Figure 15:
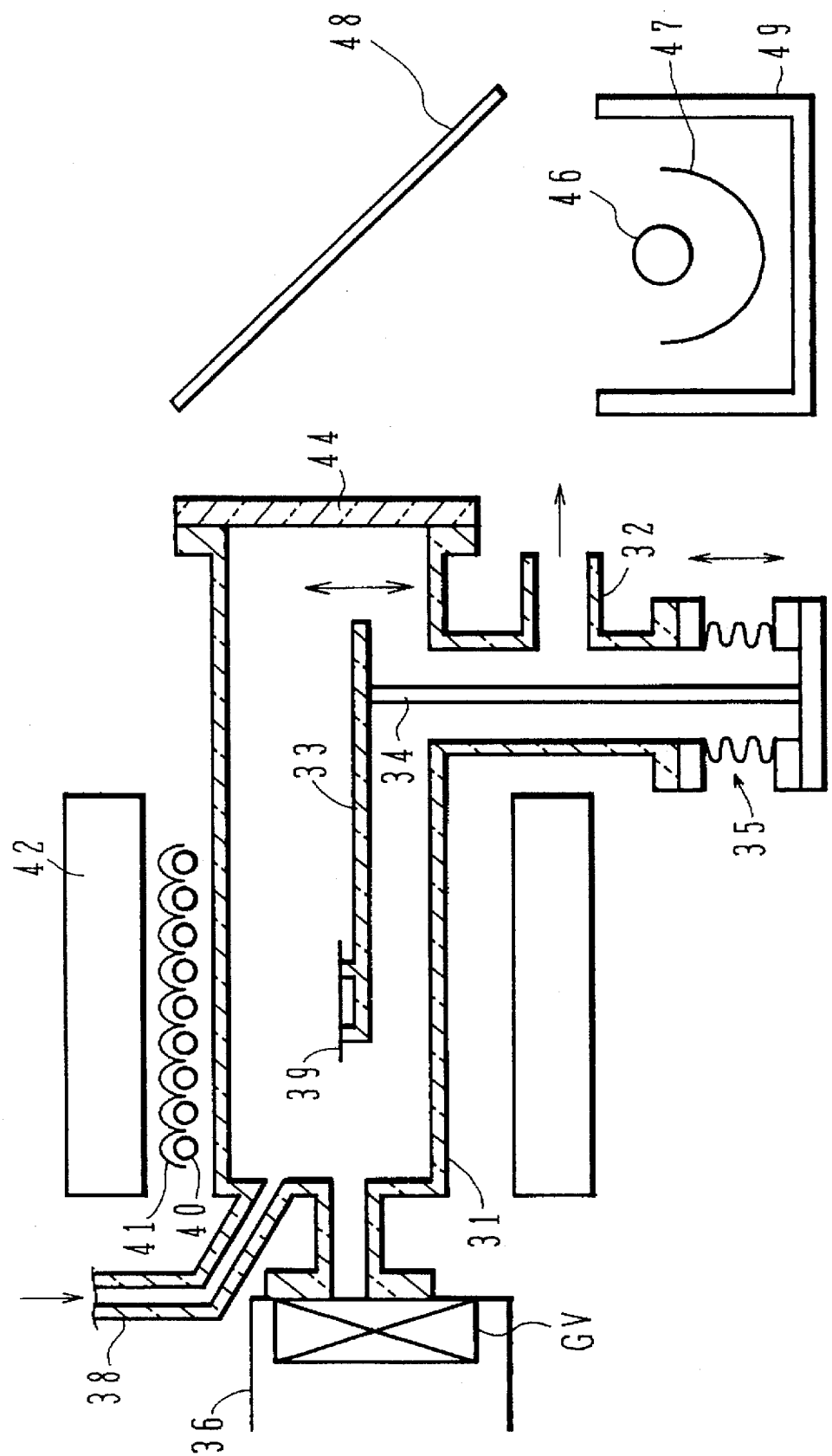

FIG. 15 shows another oxidation system using infrared or lamp heating. A chamber 31 is made of quartz and its exhaust port 32 is connected to a dry pump and a turbo molecular pump both not shown. A gas supply tube 38 is connected to the chamber 31 to introduce oxygen gas, ozone gas, chlorine gas, or the like. A quartz window 44 is formed on one side of the chamber 31 so as to introduce ultraviolet rays into the chamber 31.

A bellows element 35 made of stainless steel is hermetically mounted at the lower portion of the chamber 31. A support rod 34 is fixedly mounted on the flange at the lower portion of the bellows element 35. The support rod 34 holds at its distal end a susceptor 33. A support mechanism for supporting a wafer 39 is mounted on the surface of the susceptor 33. An adequate gap is formed between the wafer 39 and the susceptor 33 so as to allow the robot to transport a wafer onto the support mechanism. The outlet of the gas supply tube 38 is directed toward the surface of a wafer 39. Halogen lamps 40 are disposed above the chamber 31 so as to apply infrared rays to the wafer 39. A gold plated reflection mirror 41 is disposed at the back of the halogen lamps 40 so as to downwardly reflect infrared rays radiated upward. An infrared heater constituted by the halogen lamps 40 and reflection mirror 41 can heat rapidly only an object absorbing infrared rays to a high temperature. Accordingly, without excessively heating the wall of the quartz chamber 31, infrared rays of high intensity can be applied to the surface of the wafer 39 to heat it to a desired high temperature. Gas supplied from the gas supply tube 38 is introduced to the surface of the wafer 39 without being heated if it does not absorb infrared rays.

A housing 42 is provided outside the infrared lamps 40.

A mercury lamp 46 is disposed on one side of the chamber 31 so as to introduce ultraviolet rays to the upper space of the wafer via the quartz window 44. A reflection mirror 47 is disposed below the mercury lamp 46 to upwardly reflect ultraviolet rays radiated downward. Upward ultraviolet rays from the mercury lamp 46 and reflection mirror 47 are reflected by a mirror 48 and introduced via the quartz window 44 into the chamber 31. Ozone is generated by applying ultraviolet rays to $O_2$ supplied from the gas supply tube 38. To efficiently supply ozone to the wafer surface, the optical path of ultraviolet rays is designed so as to direct ultraviolet rays to the upper space of a wafer 39.

In this embodiment, a sufficient amount of ozone is supplied to the surface of a wafer 39 by applying ultraviolet rays to oxygen and ozone introduced into the chamber. The heating mechanism uses infrared rays so that a probability of heating and decomposing introduced ozone before it reaches the wafer 39 can be reduced. In this manner, it is possible to supply ozone at a low temperature to a wafer heated to a high temperature.

Figure 16:
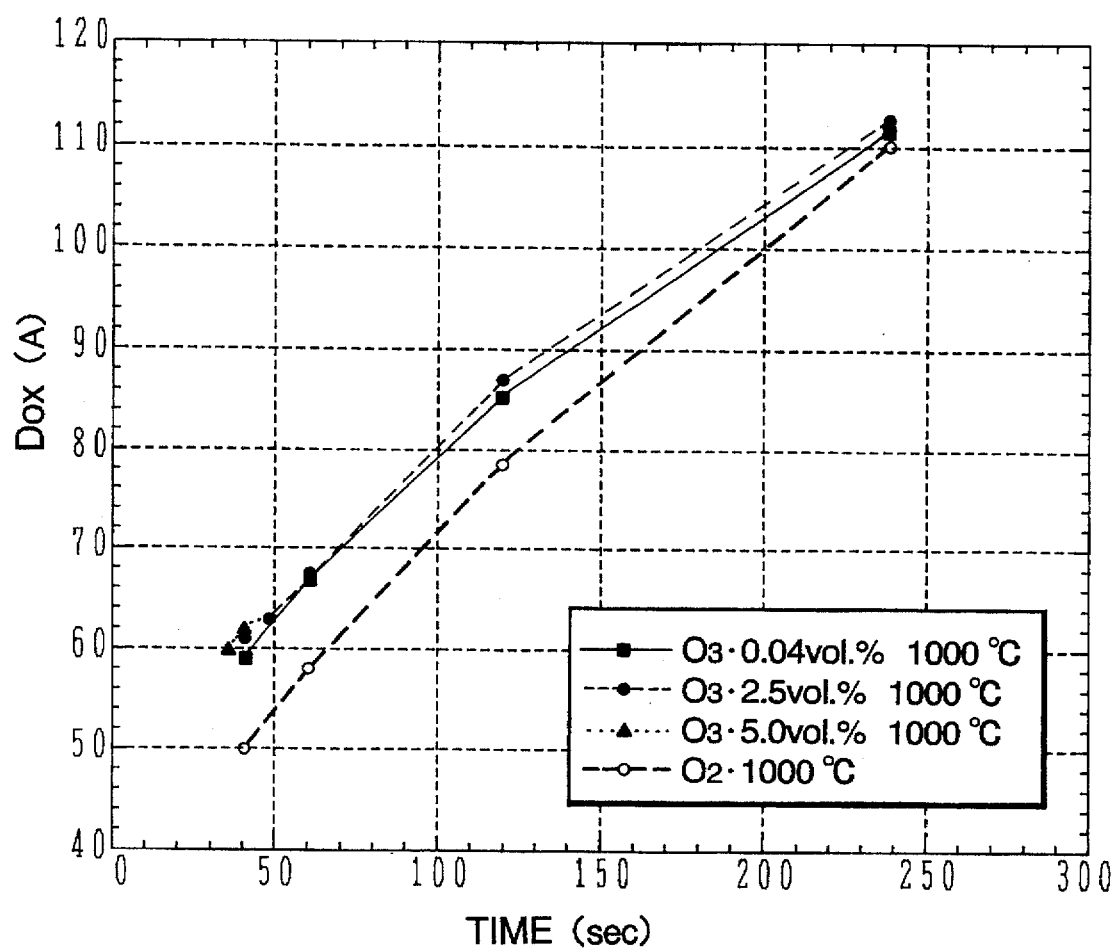
FIGS. 16 and 17 are plots showing the oxidation rates of the embodiment shown in FIG. 14.
Figure 17:
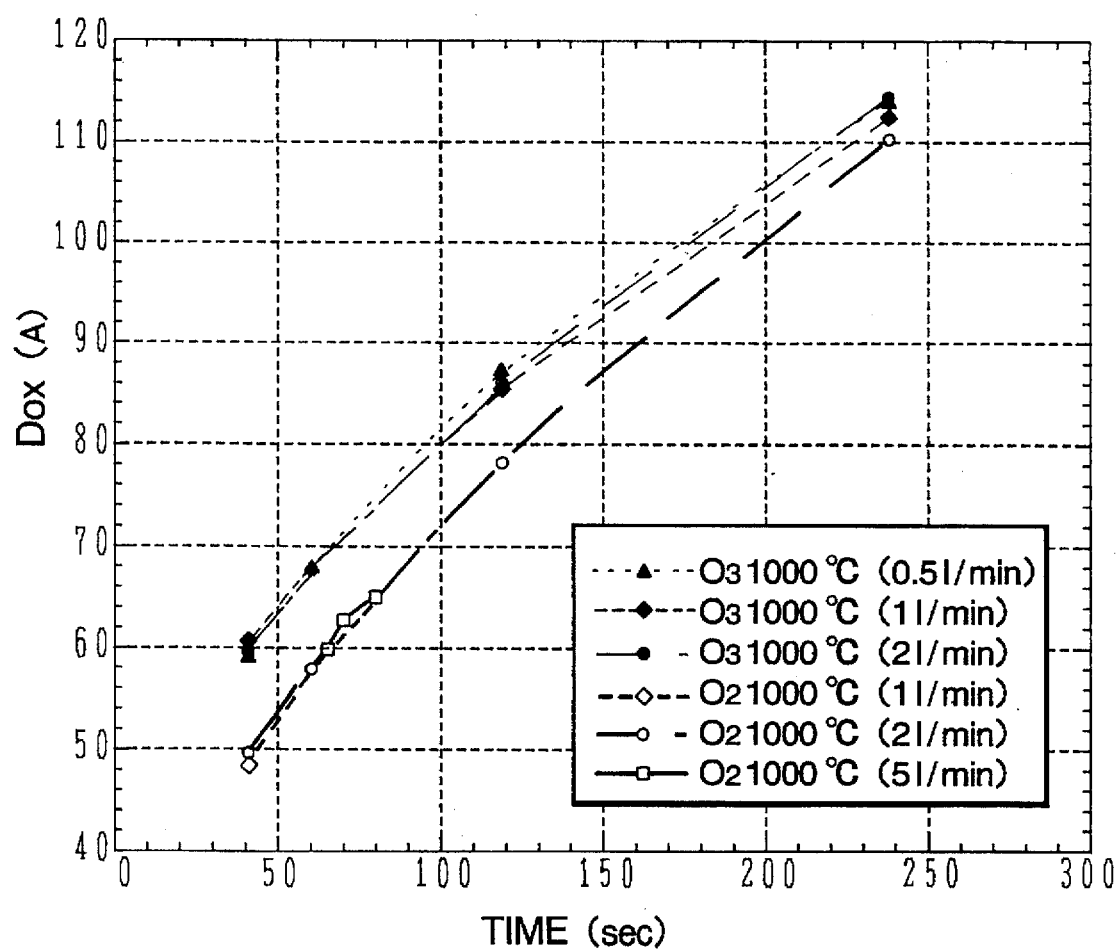

FIGS. 16 and 17 are graphs showing oxidation rates when the oxidation system shown in FIG. 15 is used. In FIG. 16, the abscissa represents a time in second, and the ordinate represents a thickness of an oxide film in angstrom. The concentration of introduced ozone was changed from 0.04 volume % 2.5 volume %, and to 5.9 volume %. The temperature at the wafer surface is set at 1000° C. An oxidation process using only oxygen without ozone was also performed for the comparison sake it can be seen from FIG. 16 that an oxidation rate becomes definitely high when ozone is introduced, as compared to an oxidation rate when only oxygen is used without ozone. However, a dependency of the oxidation rate upon the ozone concentration of from 0.04 volume % to 5.0 volume % is not clear. It is therefore conceivable that an ozone concentration of 0.04 volume % or less may attain sufficient effects. It is apparent that the introduction of ozone is preferable for the enhancement of oxidation because if ozone is not introduced, the oxidation rate lowers undoubtedly it is conceivable that ozone of at least 0.1 ppm or more is required to be introduced to the upper space of a wafer. Preferably, ozone of 0.01 volume % or more is introduced into the chamber.

FIG. 17 shows a change in the oxidation rate when a gas flow is changed. The abscissa represents a time in second, and the ordinate represents a thickness of an oxide film in angstrom. A hollow mark stands for the case where only oxygen is supplied, and a solid mark stands for the case where ozone is supplied. The ozone flow was changed from 0.5, through 1, to 2 l/min, and the oxygen flow was changed from 1, through 2, to 5 l/min. As seen from the graph, the oxidation rate changes only slightly with the oxygen flow and ozone flow. Still explicit oxidation enhancement is achieved when ozone is introduced as compared to the case of using only oxygen.

Figure 18:
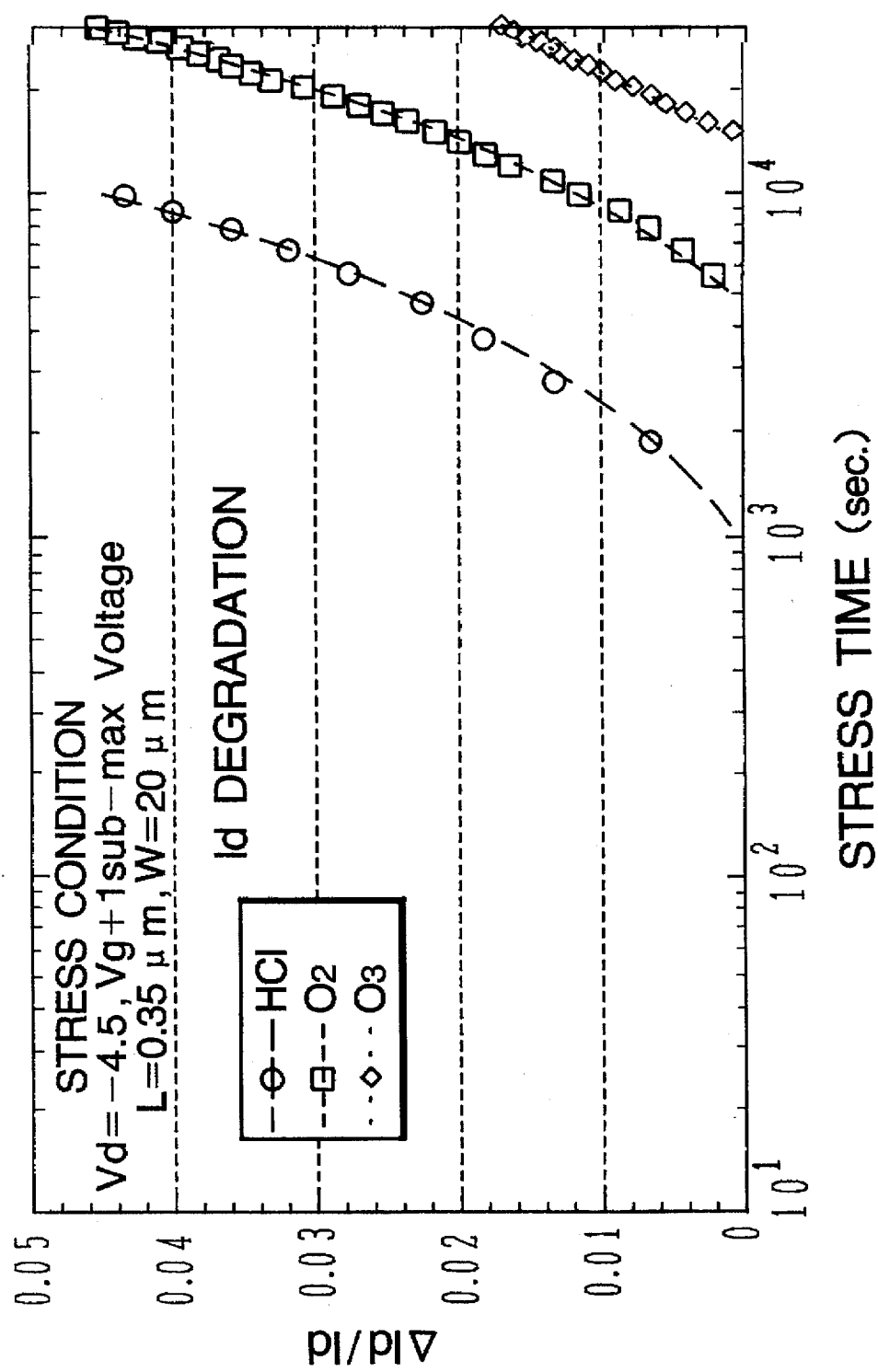
FIG. 18 is a plot showing the experimental results of Id deterioration, using the different types of silicon oxide films as a parameter.

FIG. 18 is a graph showing an ID deterioration of MOS transistors with gate oxide films formed under different conditions. A thickness of an oxide film was set to 6 nm, the gate length was set to 0.35 μm, a gate width was set to 20 μm, and a drain voltage of −4.5 V was applied to a gate electrode.

The abscissa represents a stress application time in second, and the ordinate represents a change ratio of a drain current. A hollow circle mark stands for a sample formed by hydrochloric acid oxidation, a hollow square mark stands for a sample formed by $O_2$ oxidation, and a hollow rhomboid mark stands for a sample formed by $O_3$ oxidation. As seen from FIG. 18, the stress time required for a drain current to change becomes longer in the order of hydrochloric acid oxidation, $O_2$ oxidation, and $O_3$ oxidation. The Id deterioration was improved by infrared heating and $O_3$ oxidation.

Infrared heating has been described in order to supply low temperature ozone and heating a silicon wafer to a high temperature. An internal heater such as an internal resistor heater and an induction heating susceptor may also be used with the similar effects. It is however necessary to take care of contamination by an internal heater. As in the embodiments shown in FIGS. 12 and 13, ozone may be cooled before it is introduced into the chamber.

Oxidation in a reduced pressure atmosphere has been described. Normal pressure oxidation may also be used. For example, normal pressure oxidation may be used with an infrared heating oxidation system such as shown in FIG. 15 which can suppress decomposition of ozone.

Oxide films of the invention may be used as the gate insulating films of MOSFETs, tunnel insulating films of non-volatile memories, capacitor dielectric insulating films of DRAMs, and other films in various applications.

The present invention has been described in connection with the preferred embodiments. The invention is not limited only to the above embodiments. It is apparent to those skilled in the art that various modifications, substitutions, combinations and the like can be made without departing from the scope of the appended claims.

We claim:
1. A method of forming a silicon oxide film, comprising the steps of:
 (a) transporting a silicon wafer not having an oxide film intentionally formed on a surface of active regions thereof into an evacuated chamber without contacting said silicon wafer with air, after a preparatory process including oxide removal;
 (b) introducing gas which contains oxygen and 0.01 volume % to 0.04 volume % ozone into said chamber and setting the interior of said chamber to a pressure capable of causing oxidation of the silicon wafer, said pressure capable of causing oxidation being atmospheric pressure or a lower pressure; and
 (c) heating said silicon wafer to a temperature in a range from approximately 700° C. to approximately 1100° C. while introducing gas in step (b), thereby thermally oxidizing the surface of said silicon wafer, the silicon wafer being heated after step (a) without an intervening oxidation step at a temperature below approximately 700° C.

2. A method according to claim 1, wherein said pressure capable of causing oxidation is between 200 Torr and 0.1 Torr.

3. A method according to claim 1, wherein in step (c), water vapor is introduced into said chamber.

4. A method according to claim 1, wherein in step (c), one of hydrogen chloride gas and chlorine gas is introduced into said chamber.

5. A method according to claim 1, wherein step (c) further includes a substep of cooling said gas which contains ozone before said gas is introduced into said chamber.

6. A method according to claim 5, wherein said substep of cooling cools said gas which contains ozone to a temperature in the range from liquid nitrogen temperature to room temperature.

7. A method according to claim 6, wherein said pressure capable of causing oxidation is between 200 Torr and 0.1 Torr.

8. A method according to claim 1, wherein in step (c) said silicon wafer is heated by an infrared lamp.

9. A method according to claim 8, wherein said gas which contains oxygen and 0.01 volume % to 0.04 volume % ozone is introduced in step (b) from a gas supply tube directed to the surface of said silicon wafer.

10. A method according to claim 8, wherein said pressure capable of causing oxidation is atmospheric pressure.

11. A method of forming a silicon oxide film, comprising the steps of:
 (a) transporting a silicon wafer not having an oxide film intentionally formed on a surface of active regions thereof into an evacuated chamber without contacting said silicon wafer with air, after a preparatory process including oxide removal;
 (b) introducing oxygen gas into said chamber and setting the interior of said chamber to a pressure capable of causing oxidation on the silicon wafer; and (c) applying ultraviolet radiation to said oxygen gas introduced into said chamber to generate ozone at a concentration in a range from 0.01 volume % to 0.04 volume %, and heating said silicon wafer to a temperature in a range from approximately 700° C. to 1100° C., thereby thermally oxidizing the surface of said silicon wafer.

12. A method according to claim 11, wherein said pressure capable of causing oxidation on the silicon wafer is atmospheric pressure or lower.

13. A method according to claim 11, wherein in step (c), water vapor is introduced into said chamber.

14. A method according to claim 11, wherein in step (c), one of hydrogen chloride gas and chlorine gas is introduced into said chamber.

15. A method according to claim 11, wherein step (b) introduces ozone gas together with said oxygen gas.

16. A method according to claim 15, wherein step (b) includes a substep of cooling said ozone gas before said ozone gas is introduced into said chamber.

17. A method according to claim 16, wherein said substep of cooling cools said ozone gas to a temperature in the range from liquid nitrogen temperature to room temperature.

18. A method according to claim 11, wherein said pressure capable of causing oxidation on the silicon wafer is between 200 Torr and 0.1 Torr.

19. A method of forming a silicon oxide film, comprising the steps of:

(a) transporting a silicon wafer not having an oxide film intentionally formed on a surface of active regions thereof into an evacuated chamber without contacting said silicon wafer with air, after a preparatory process including oxide removal, said chamber having an upper hot zone and a lower cool zone, the wafer being first introduced into said lower cool zone;

(b) introducing gas which contains ozone at a concentration in a range from 0.1 ppm to 2.5 volume % into said chamber and setting the interior of said chamber to a pressure capable of causing oxidation of the silicon wafer; and (c) elevating said silicon wafer from said lower cool zone to said upper hot zone in the gas which contains ozone, to heat the silicon wafer to a temperature in a range from approximately 700° C. to approximately 1100° C., thereby thermally oxidizing the surface of said silicon wafer without using a plasma, the silicon wafer being heated after steps (a) and (b) without an intervening oxidation step at a temperature below approximately 700° C.

20. A method according to claim 19, wherein said upper hot zone is heated with a resistance heater disposed around said upper hot zone.

21. A method according to claim 19, wherein the heating in step (c) is done with a lamp heater.

22. A method according to claim 20, wherein the chamber has an interior wall made of quartz.

23. A method according to claim 19, wherein the gas introduced in step (b) has an ozone concentration in a range from 0.01 to 0.04 vol. %.

* * * * *